US009843711B2

United States Patent
Mishima et al.

(10) Patent No.: US 9,843,711 B2
(45) Date of Patent: Dec. 12, 2017

(54) IMAGE PROCESSING DEVICE, IMAGE PROCESSING METHOD, AND IMAGE PROCESSING PROGRAM

(71) Applicant: KABUSHIKI KAISHA TOSHIBA, Tokyo (JP)

(72) Inventors: Nao Mishima, Tokyo (JP); Takeshi Mita, Kanagawa (JP); Yusuke Moriuchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 14/746,952

(22) Filed: Jun. 23, 2015

(65) Prior Publication Data

US 2015/0381878 A1 Dec. 31, 2015

(30) Foreign Application Priority Data

Jun. 30, 2014 (JP) ................................. 2014-135107

(51) Int. Cl.
*H04N 5/232* (2006.01)
*H04N 5/235* (2006.01)

(52) U.S. Cl.
CPC ....... *H04N 5/23212* (2013.01); *H04N 5/2356* (2013.01); *H04N 5/23229* (2013.01); *H04N 5/23232* (2013.01); *G06T 2207/20221* (2013.01)

(58) Field of Classification Search
CPC ............ H04N 5/23212; H04N 5/2356; H04N 5/23232; H04N 5/23229; H04N 5/2226; H04N 5/23216; H04N 5/2625; G02B 7/38; G02B 27/0075; G06T 5/003; G06T 5/50; G06T 2207/20221; G03B 13/32; G03B 13/36
See application file for complete search history.

(56) References Cited

U.S. PATENT DOCUMENTS

| 8,767,085 B2 * | 7/2014 | Park ................... H04N 5/23212 348/208.1 |
| 8,917,333 B2 * | 12/2014 | Park ................... H04N 5/23212 348/222.1 |
| 9,300,855 B2 * | 3/2016 | Kawamura ........ H04N 5/23212 |
| 9,344,619 B2 * | 5/2016 | Shroff .................... G06T 7/0051 |
| 2003/0016306 A1 | 1/2003 | Ogata et al. |

(Continued)

FOREIGN PATENT DOCUMENTS

| JP | 2003-8898 | 1/2003 |
| JP | 2007-067909 | 3/2007 |

(Continued)

*Primary Examiner* — Michael Osinski
(74) *Attorney, Agent, or Firm* — Finnegan, Henderson, Farabow, Garrett & Dunner, L.L.P.

(57) ABSTRACT

According to one embodiment, an image processing device includes an imaging element, a lens and an image processor. Light passes through the lens toward the imaging element. A relative position of the imaging element and the lens is changeable. The image processor acquires a first image and a second image. The image processor derives a first stored image by adding at least a portion of the second image to the first image. The first image is captured by the imaging element when the relative position is in a first range. The second image is captured by the imaging element when the relative position is in a second range different from the first range.

17 Claims, 11 Drawing Sheets

(56) References Cited

U.S. PATENT DOCUMENTS

| | | | |
|---|---|---|---|
| 2004/0080661 A1* | 4/2004 | Afsenius | G02B 7/36 348/345 |
| 2005/0259888 A1* | 11/2005 | Ozluturk | H04N 5/23248 382/260 |
| 2006/0127084 A1* | 6/2006 | Okada | H04N 5/23232 396/439 |
| 2006/0198623 A1* | 9/2006 | Ono | G03B 13/32 396/89 |
| 2007/0046785 A1 | 3/2007 | Matsumoto et al. | |
| 2008/0013941 A1* | 1/2008 | Daley | G06T 5/50 396/121 |
| 2008/0129857 A1* | 6/2008 | Vau | H04N 5/2254 348/345 |
| 2008/0259176 A1* | 10/2008 | Tamaru | G03B 13/32 348/222.1 |
| 2009/0059026 A1 | 3/2009 | Katagiri et al. | |
| 2009/0059057 A1* | 3/2009 | Long | G02B 15/02 348/343 |
| 2009/0169122 A1* | 7/2009 | He | H04N 5/23212 382/238 |
| 2009/0213230 A1* | 8/2009 | Liao | H04N 13/0221 348/207.99 |
| 2009/0225199 A1* | 9/2009 | Ferren | H04N 5/23212 348/240.99 |
| 2011/0279699 A1* | 11/2011 | Matsui | H04N 5/20 348/222.1 |
| 2012/0013737 A1* | 1/2012 | Umeyama | H04N 5/235 348/135 |
| 2012/0070097 A1* | 3/2012 | Adams, Jr. | H04N 5/23212 382/255 |
| 2012/0148109 A1* | 6/2012 | Kawamura | G01C 3/06 382/106 |
| 2012/0274779 A1* | 11/2012 | Tanaka | H04N 5/3653 348/164 |
| 2012/0281132 A1* | 11/2012 | Ogura | H04N 5/23212 348/348 |
| 2013/0010160 A1* | 1/2013 | Kawamura | G06T 5/003 348/231.99 |
| 2013/0121537 A1* | 5/2013 | Monobe | H04N 5/23254 382/106 |
| 2013/0147982 A1 | 6/2013 | Hirayama | |
| 2014/0009572 A1 | 1/2014 | Matsumoto et al. | |
| 2014/0219581 A1* | 8/2014 | Astrand | G06T 3/4038 382/284 |
| 2014/0354781 A1* | 12/2014 | Matsuyama | H04N 5/23212 348/49 |
| 2015/0002724 A1* | 1/2015 | Chuang | H04N 5/23293 348/346 |
| 2015/0071567 A1 | 3/2015 | Mishima et al. | |
| 2015/0084930 A1 | 3/2015 | Watanabe et al. | |
| 2015/0085179 A1* | 3/2015 | Van Heugten | H04N 5/23212 348/349 |
| 2015/0145988 A1* | 5/2015 | Numata | G06T 5/002 348/135 |
| 2015/0222920 A1 | 8/2015 | Mishima et al. | |
| 2015/0326786 A1 | 11/2015 | Mishima et al. | |
| 2015/0326798 A1* | 11/2015 | Muto | H04N 5/23229 348/239 |
| 2016/0142618 A1* | 5/2016 | Tokui | G02B 7/36 348/349 |
| 2017/0070664 A1* | 3/2017 | Yoon | H04N 5/23212 |

FOREIGN PATENT DOCUMENTS

| | | |
|---|---|---|
| JP | 2008-271240 | 11/2008 |
| JP | 2009-59058 | 3/2009 |
| JP | 2012-005063 | 1/2012 |
| JP | 2012-028877 | 2/2012 |
| JP | 2013-110700 | 6/2013 |
| JP | 2014-17539 | 1/2014 |
| JP | 2015-053614 | 3/2015 |
| JP | 2015-064724 | 4/2015 |
| JP | 2015-148965 | 8/2015 |
| JP | 2015-216459 | 12/2015 |

\* cited by examiner

IMAGE PROCESSING DEVICE, IMAGE PROCESSING METHOD, AND IMAGE PROCESSING PROGRAM

CROSS-REFERENCE TO RELATED APPLICATIONS

This application is based upon and claims the benefit of priority from Japanese Patent Application No. 2014-135107, filed on Jun. 30, 2014; the entire contents of which are incorporated herein by reference.

FIELD

Embodiments described herein relate generally to an image processing device, an image processing method, and an image processing program.

BACKGROUND

An image processing method, an image processing device, and an image processing program obtain an all-focused image by, for example, changing the position of the focal point (the focus) when exposing and by processing the images that are captured. High quality is desirable for the image corresponding to such multiple focus positions.

DETAILED DESCRIPTION

Figure 1:
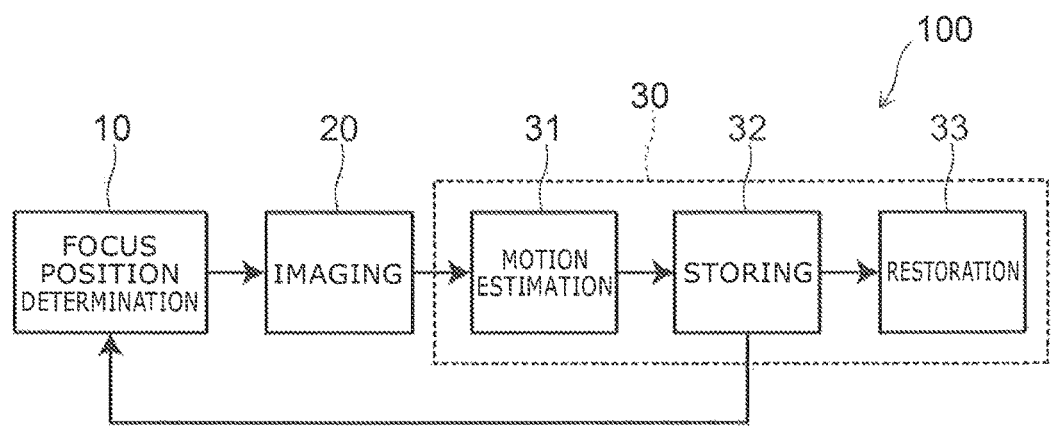
FIG. 1 is a block diagram showing an image processing device according to a first embodiment.

According to one embodiment, an image processing device includes an imaging element, a lens and an image processor. Light passes through the lens toward the imaging element. A relative position of the imaging element and the lens is changeable. The image processor acquires a first image and a second image. The image processor derives a first stored image by adding at least a portion of the second image to the first image. The first image is captured by the imaging element when the relative position is in a first range. The second image is captured by the imaging element when the relative position is in a second range different from the first range.

According to one embodiment, an image processing method is disclosed. The method includes acquiring a first image captured by an imaging element when a relative position of the imaging element and a lens is in a first range. Light passes through the lens toward the imaging element. The method includes acquiring a second image captured by the imaging element when the relative position is in a second range different from the first range. The method includes deriving a first stored image by adding at least a portion of the second image to the first image.

According to one embodiment, a computer readable non-transitory storage medium comprising an image processing program is disclosed. The program causes a computer to execute processing. The processing includes acquiring a first image captured by an imaging element when a relative position of the imaging element and a lens is in a first range. Light passes through the lens toward the imaging element. The processing includes acquiring a second image captured by the imaging element when the relative position is in a second range different from the first range. The processing includes deriving a first stored image by adding at least a portion of the second image to the first image.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a block diagram illustrating an image processing device according to a first embodiment.

Figure 2:
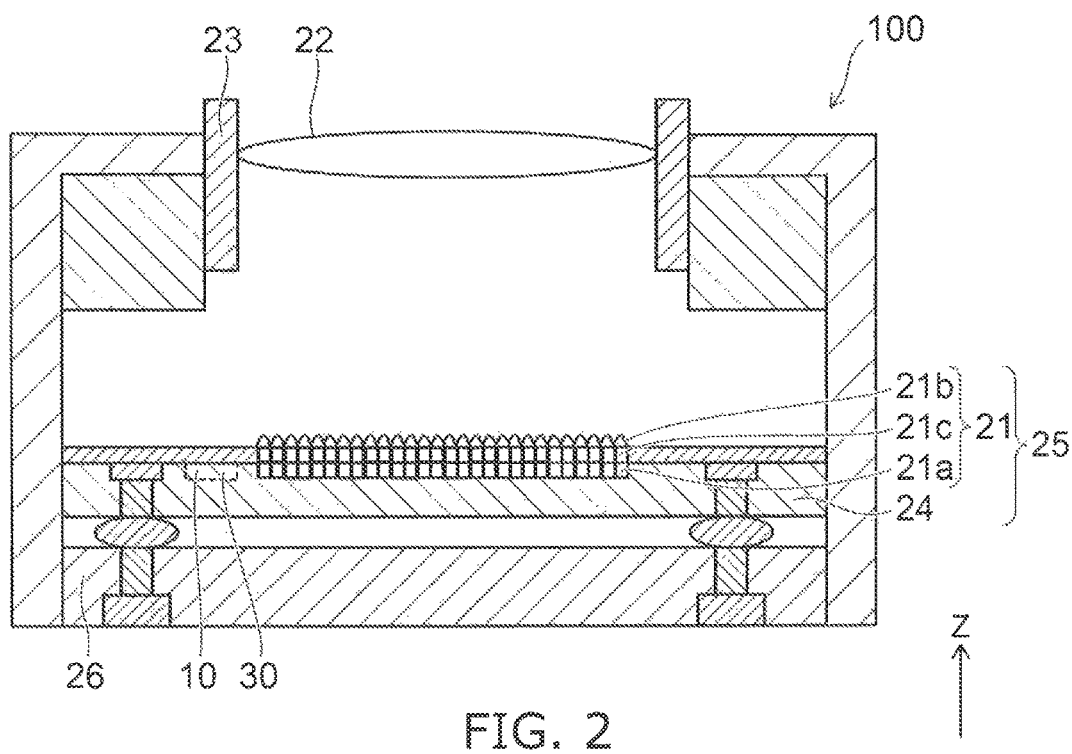
FIG. 2 is a schematic cross-sectional view showing the image processing device according to the first embodiment.

FIG. 2 is a schematic cross-sectional view illustrating the image processing device according to the first embodiment.

As shown in FIG. 1, the image processing device 100 according to the first embodiment includes a focus position determination unit 10 (a position determination unit), an imaging unit 20, and an image processor 30. As shown in FIG. 2, the imaging unit 20 includes a lens 22 and an imaging element 25.

The lens 22 is an Imaging lens that transmits incident light toward the imaging element 25. The relative position (the focus position) of the lens 22 with respect to the imaging element 25 is changeable. By modifying the focus position in the imaging unit 20, the subject can be in focus, or the focus can be shifted from the subject.

Multiple images are captured by the imaging unit 20. The multiple images that are captured are input to the image processor 30 moment to moment. The image processor 30 stores the multiple images that are input and derives an output image based on the multiple images that are stored. Thus, for example, a high-quality output image in which the noise is suppressed can be obtained by using the multiple images.

The focus position determination unit 10 shown in FIG. 1 determines the relative position of the lens 22 with respect to the imaging element 25. The imaging unit 20 modifies the focus position to the determined position and captures an image. A storage unit 32 of the image processor 30 stores the image that is captured in a stored image stored in a storage buffer. Further, the imaging unit 20 modifies the focus position to another position determined by the focus position determination unit 10 and captures an image. The image that is captured is further additively stored to the stored image. Thus, in the embodiment, the stored image to which the images are added is obtained by repeating the modification of the focus position and the capturing.

The stored image is an image that is blurred with same strength in whole image and includes information corresponding to multiple different focus positions. The image processor 30 (a restoration unit 33) performs blur removal processing on such a stored image. Thereby, a high-quality output image can be obtained. An image (e.g., an all-focused image) can be obtained in which subjects having mutually-different distances from the imaging element are in focus.

In FIG. 2, a direction from the imaging element 25 toward the lens 22 is taken as a Z-axis direction.

In the example, an imaging region 21 and a semiconductor substrate 24 are provided in the imaging element 25. For example, the imaging region 21 is disposed at a position so that the imaging region 21 and the lens 22 overlap as viewed from the Z-axis direction.

The lens 22 is held by a lens holder 23. The optical axis of the lens 22 is disposed to be aligned with the Z-axis direction. For example, the focus position is adjusted by an adjustment mechanism provided in the lens holder 23.

For example, the focus position determination unit 10 and the image processor 30 are provided in the semiconductor substrate 24. At least a portion of the focus position determination unit 10 and the image processor 30 may be provided separately from the semiconductor substrate 24. A circuit substrate 26 is further provided; and at least a portion of the focus position determination unit 10 and the image processor 30 may be provided in the circuit substrate 26.

For example, a photodiode layer 21*a*, a microlens layer 21*b*, and a color filter layer 21*c* are provided in the imaging region 21. The color filter layer 21*c* is disposed between the photodiode layer 21*a* and the microlens layer 21*b*.

The multiple photodiodes that are arranged in a plane perpendicular to the Z-axis direction are provided in the photodiode layer 21*a*. Multiple microlenses that are arranged in the plane perpendicular to the Z-axis direction are provided in the microlens layer 21*b*. Multiple color filters that are arranged in the plane perpendicular to the Z-axis direction are provided in the color filter layer 21*c*. For example, one color filter is provided between one photodiode and one microlens.

The configuration shown in FIG. 2 is an example; and the focus position determination unit 10, the imaging unit 20, the image processor 30, etc., of the embodiment are not limited to the example recited above. Various modifications of the embodiment are possible. For example, the imaging element 25 may include a general imaging element such as a CMOS image sensor, a CCD image sensor, etc. A mechanism that moves the imaging element 25 may be used to modify the focus position.

Figure 3:
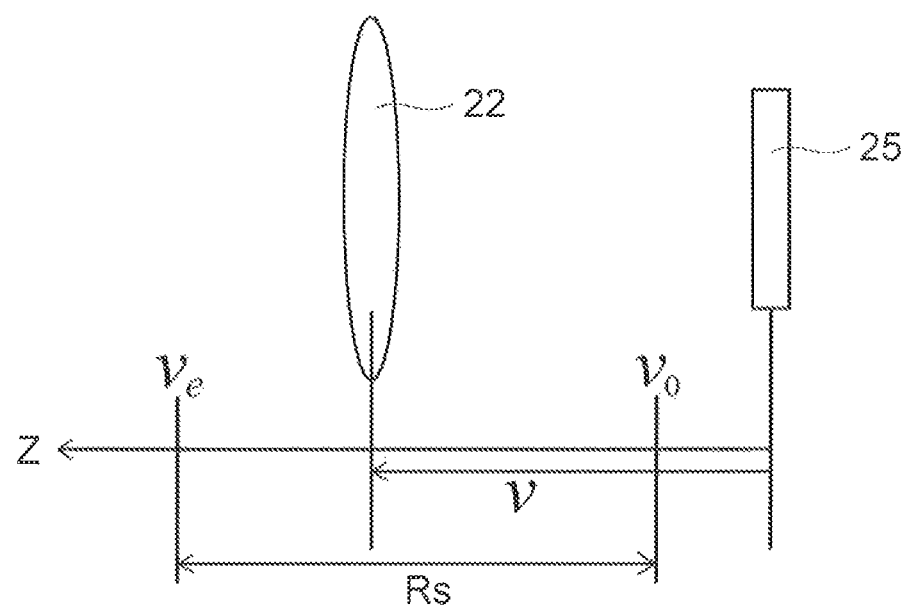
FIG. 3 is a schematic view showing the image processing device according to the first embodiment.

FIG. 3 is a schematic view illustrating the image processing device according to the first embodiment.

Here, a focus position v is the focus position (the relative position of the lens 22 with respect to the imaging element 25). In the example, the focus position v is the position of the lens 22. In the case where the mechanism that moves the imaging element 25 is used, the focus position is the position of the imaging element 25.

A sweep range Rs is the range in which the focus position v changes (moves). The sweep range Rs is a preset range in which the focus position v is changeable. The depth of the all-focused image increases as the sweep range Rs increases. The sweep range Rs is defined as follows.

[Formula 1]

$$v_0 \leftrightarrow v_e \quad (1)$$

Namely, the focus position v is changeable between a position $v_0$ and a position $v_e$.

Figure 4:
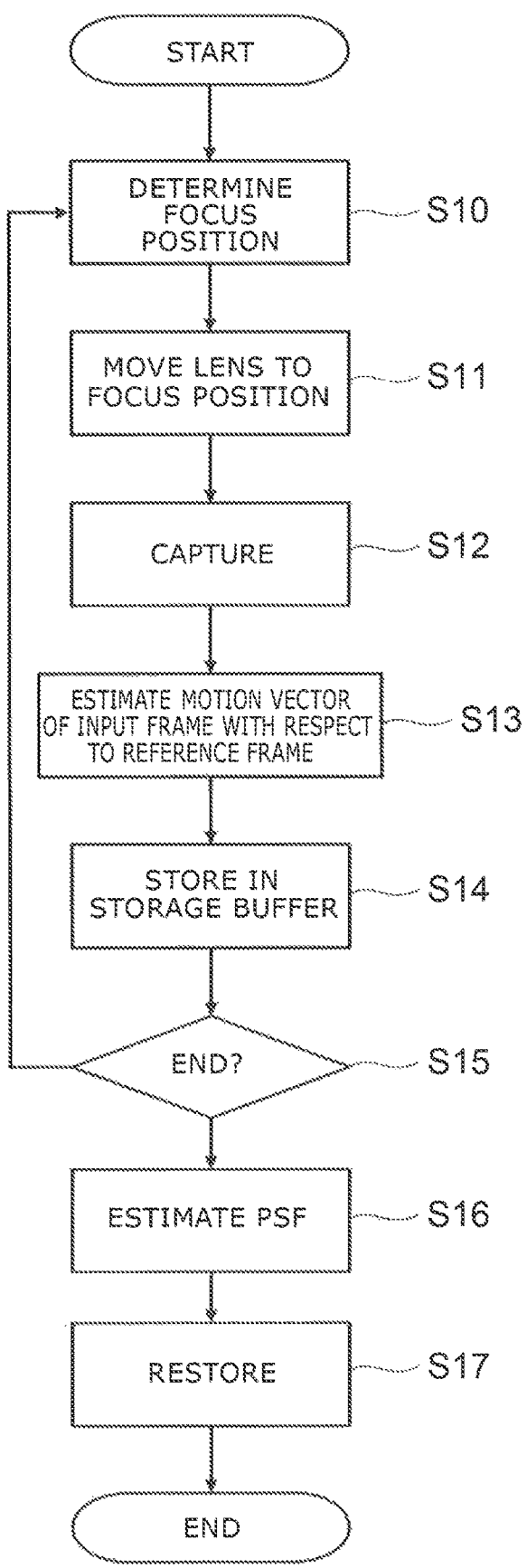
FIG. 4 is a flowchart showing operations of the image processing device according to the first embodiment.

FIG. 4 is a flowchart illustrating operations of the image processing device according to the first embodiment.

The image processing method of the image processing device 100 includes step S10 to step S17.

In step S10, the focus position determination unit 10 determines the focus position when capturing. The focus position determination unit 10 determines to perform the capturing when the focus position is a first position. Then, after implementing steps S11 to S15 described below, it is determined again in step S10 to perform the capturing when the focus position is a second position. The second position is a focus position that is different from the first position.

The repeated processing of steps S10 to S15 shown in FIG. 4 may be performed as the repeated processing of steps S11 to S15. In such a case, in step S10, the focus position determination unit 10 determines to capture the images at multiple focus positions.

Various variations of the determination of the focus position may be used. For example, the focus position may be determined randomly inside the sweep range Rs. In other words, the first position and the second position may be positions selected randomly in the sweep range Rs.

The focus position inside the sweep range Rs may be determined according to an appropriate division width. In other words, each of the first position and the second position may be at least one of multiple positions arranged at uniform spacing in the sweep range Rs.

It is favorable for the multiple focus positions v to have moderate fluctuation inside the sweep range Rs. For example, the focus position that is used as the first position is such that the distance between the imaging element 25 and the optical axis-direction center of the lens 22 is the focal length of the lens 22. In such a case, the focus of the imaging unit 20 corresponds to infinity. The focus position that is used as the second position is such that the distance between the imaging element 25 and the optical axis-direction center of the lens 22 is shorter than the focal length of the lens 22. For example, the second position corresponds to the shortest capturing distance of the imaging unit 20. The input images are captured at multiple focus positions between such first and second positions. In the embodiment, the multiple input images may include input images captured at the same focus position.

In the example recited above, the focus position is fixed when capturing. In the embodiment, the focus position may be moving when exposing. For example, the imaging element 25 captures the first image when the focus position is in the first range. A first range includes the first position; and the focus position is changed within the first range while capturing the first image. Similarly, the imaging element 25 captures the second image when the focus position is in a second range that is different from the first range. The second range includes the second position; and the focus position is changed within the second range while capturing the second image.

In step S11, the lens 22 (or the imaging element 25) is moved to the focus position determined by the focus position determination unit 10. For example, the lens 22 is moved to a position so that the focus position is the first position.

In step S12, the imaging element 25 captures an image. For example, the imaging element 25 captures the first image when the focus position is the first position. After steps S13 to S15 described below, steps S10 to S12 are repeated again; and the imaging element 25 captures the second image when the focus position is the second position.

Here, the pixel value at the coordinates (x, y) of the image (the input image) captured at any focus position v is defined as $I_{src}(x, y; v)$. The value of the input image may be a scalar such as a luminance value or may be a vector used in a color image (e.g., RGB or YUV).

In step S13, the image processor 30 performs motion estimation. In the motion estimation, the motion vector from the input image to the reference image is detected. Here, the reference image is the image used as the reference of the storing. One image among the input images may be used as the reference image. For example, the initial input image when starting the processing is used as the reference image. The pixel value at the coordinates (x, y) of the reference image is defined as $I_{ref}(x, y)$.

For example, the first image that is captured at the first position is used as the reference image. Subsequently, the second image that is captured at the second position is used as the input image; and the motion vector from the second image to the first image is detected. The motion vector is the vector according to the difference between the position of a subject (an object) inside the first image and the position of the subject inside the second image.

Various methods may be used to detect the motion vector. For example, block matching may be used. However, the method for detecting the motion vector is not limited to block matching.

Block matching is a method that includes subdividing the input image into multiple rectangular blocks and searching for the block in the reference image that corresponds to each block. The size of one block is $M_1$ by $M_2$. The position of the block is (i, j). The mean absolute difference (MAD), etc., may be used as the error function for determining the motion.

[Formula 2]

$$MAD(i, j, u) = \frac{1}{M_1 M_2} \sum_{0 \le m < M_1, 0 \le n < M_2} | I_{src}(M_1 i + m, M_2 j + n; v) - I_{ref}(M_1 i + m + u_x, M_2 j + n + u_y)| \quad (2)$$

Here, the vector $u=(u_x, u_y)^T$ is the motion vector to be evaluated. T is the transpose.

In the case where the range of search is the rectangular region of $-W \le x \le W$ and $-W \le y \le W$, the following block matching algorithm determines the motion vector $u(i, j)$ at the position (i, j).

[Formula 3]

$$u_{LM}(i, j) = \underset{-W \le u_x \le W, -W \le u_y \le W}{\operatorname{argmin}} MAD(i, j, (u_x, u_y)^T) \quad (3)$$

Here, the search for $u_x$ and $u_y$ to minimize an error function E is expressed by

[Formula 4]

$$\underset{-W \le u_x \le W, -W \le u_y \le W}{\operatorname{argmin}} E. \quad (4)$$

The motion vector inside the block is the same as the motion vector of the block. Namely,

[Formula 5]

$$u(x,y):=u(i,j) \quad (5)$$

The matching may be performed with a precision that includes positions having coordinates expressed in decimals. For example, isometric linear fitting or the like may be used.

Here, the motion vector may not be detected; and, for example, a motion vector that is used for compression by video encoding such as MPEG2 may be used. The motion vector that is decoded by a decoder may be used.

When detecting the motion vector, the parametric motion that expresses the motion of the entire screen may be determined. For example, the parametric motion of the entire screen is determined using the Lucas-Kanade method. The motion vector is determined from the parametric motion that is determined.

The parametric motion expresses the motion using a parameterized projection. For example, the motion of the coordinates (x, y) may be expressed as follows using an affine transformation.

[Formula 6]

$$p(x, y)a = \begin{bmatrix} x & y & 1 & 0 & 0 & 0 \\ 0 & 0 & 0 & x & y & 1 \end{bmatrix} \begin{bmatrix} a_0 \\ a_1 \\ a_2 \\ a_3 \\ a_4 \\ a_5 \end{bmatrix} \quad (6)$$

The vector $a=(a_0, a_1, a_2, a_3, a_4, a_5)^T$ is a parameter that expresses the motion. Such a motion parameter is estimated from the entire screen using the Lucas-Kanade method. In the Lucas-Kanade method, the following steps 1 to 4 are implemented.

Step 1:

The Gradient

[Formula 7]

$$\nabla I_{ref} = \left( \frac{\partial I_{ref}}{\partial x}, \frac{\partial I_{ref}}{\partial y} \right) \quad (7)$$

is calculated.

Step 2:
The Hessian Matrix

[Formula 8]

$$H = \sum_{x,y} (\nabla I_{ref}(p(x, y)a^{(t-1)})p(x, y))^T (\nabla I_{ref}(p(x, y)a^{(t-1)})p(x, y)) \quad (8)$$

is calculated.
Step 3:

[Formula 9]

$$\Delta a = H^{-1} \sum_{x,y} (\nabla I_{ref}(p(x, y)a^{(t-1)})p(x, y))^T \quad (9)$$

$$(I_{src}(x, y; v) - I_{ref}(p(x, y)a^{\wedge}(t-1)))$$

is calculated.
Step 4:
The Update
[Formula 10]

$$a^{(t)} = a^{(t-1)} + \Delta a \quad (10)$$

is calculated. Steps 2 to 4 are repeated until a specified number is reached. Here, the number of iterations is expressed by the superscript t.

When the parameters have been determined, the motion vector at any coordinate position can be determined by
[Formula 11].

$$u(x,y) = p(x,y)a - (x,y)^T \quad (11)$$

Also, for example, a feature point may be calculated for each of the two frames; and the parametric motion may be determined from the association between the feature points.

In step S14, the image processor 30 stores the input image in the storage buffer.

The storage buffer is a buffer for storing the input image aligned with the reference image. The input image is stored in the stored image stored in the storage buffer. The resolution of the stored image may not be the same as the resolution of the input image. For example, the resolution of the stored image may be 2 times, 3 times, or 4 times that of the input image in the vertical direction and the horizontal direction. For example, a super-resolution effect occurs by increasing the resolution. Thereby, a high-quality image can be generated. The resolution of the stored image may be lower than the resolution of the input image.

The coordinates of the stored image are the coordinates (X, Y). The pixel value at the coordinates (X, Y) of the stored image is B(X, Y). As described above, there are cases where the resolution of the stored image is different from the resolution of the input image. Therefore, when storing, the scale of the motion vector determined at the resolution of the input image is transformed to correspond to the resolution of the stored image.
[Formula 12]

$$U(x,y) = \rho u(x,y) \quad (12)$$

Here, the vector U(x, y) is the motion vector that is subjected to the scale transformation. $\rho$ is the ratio of the resolution of the input image and the resolution of the stored image.

Then, the position is determined where the value $I_{src}(x, y; v)$ of the pixel of the input image is stored. Using the motion vector subjected to the scale transformation, the storage position coordinate on the stored image is

[Formula 13]

$$D(x, y) = \rho \begin{bmatrix} x \\ y \end{bmatrix} + U(x, y). \quad (13)$$

Here, $\rho$ is the ratio of the resolution of the input image and the resolution of the stored image.

The pixel $I_{src}(x, y; v)$ of the input image is stored in the stored image.

The storage position coordinate is the coordinate D(x, y); but the coordinate D(x, y) may be in decimals. Therefore, the discrete ordinate at the vicinity of the storage position coordinate is determined.

[Formula 14]

$$X = \begin{bmatrix} X \\ Y \end{bmatrix} = \text{round}(D(x, y)) \quad (14)$$

Here, the vicinity discrete ordinate is expressed by [Formula 15].

$$X = (X, Y)^T \quad (15)$$

Each component of the storage position coordinate being rounded to the nearest whole number is expressed by [Formula 16].

$$\text{round}(D(x,y)) \quad (16)$$

The storing is implemented as follows by adding the pixel value of the input image to the stored image at the vicinity discrete ordinate.
[Formula 17]

$$B(X,Y) += I_{src}(x,y;v) \quad (17)$$

Here, z+=a expresses a being added to z.

In the embodiment, as described below, a weight is considered for each of the pixels of the stored image when deriving the output image from the stored image. The weight is stored in the storing weight image stored in the storing weight buffer. The resolution of the storing weight image is the same as the resolution of the stored image. The pixel value at the coordinates (X, Y) of the storing weight image is defined as W(X, Y).

In step S14, the storing of the weight also is implemented. The weight of storing is stored in the storing weight image for each of the pixels of the stored image.

Namely, the following is implemented.
[Formula 18]

$$W(X,Y) += 1.0 \quad (18)$$

In the example, the weight W(X, Y) of storing of each pixel of the stored image corresponds to the number of times the input image is added for the pixel.

When adding the input image to the stored image, the adding may be performed not for the entire input image but for a portion of the input image. For example, the user can designate the central portion, etc., of the image as the region to be processed. In such a case, the portion of the input image corresponding to the region to be processed is added to the stored image.

As described above, the motion vector from the input image to the reference image is estimated; and the input image is aligned based on the motion vector that is estimated. The stored image is derived by storing the input image that is aligned.

For example, the stored image (a first stored image) is derived by adding at least a portion of the second image to the first image based on the motion vector from the second image to the first image described above. In other words, the stored image is derived by moving the position of the second image (the position of the subject inside the image) based on the motion vector and adding the pixel values of the second image after the movement to the pixel values of the first image. The first stored image is an image in which at least a portion of the second image is added to the first image; and other input images may be further added.

In the method of the image processing according to the embodiment, step S10 to step S14 are multiply repeated as shown in FIG. 4. In step S15, it is determined whether or not to end the repetition. In the case where the repetition does not end, steps S10 to S14 are implemented again. For example, the focus position is modified further; and an image is captured. Thus, the image processor 30 acquires multiple input images including the first image and the second image. The focus positions when the multiple input images are captured are different from each other. The image processor 30 derives the first stored image by adding at least a portion of the multiple input images that are acquired.

In step S15, for example, the repetition ends when the input image is stored a prescribed number of times. In the case where the repetition ends, step S16 is implemented.

The stored image is an image that includes information of different multiple focus positions and Is blurred in the screen. In step S16 and step S17, the output image is derived by implementing blur removal processing on the stored image. For example, the image processor 30 derives the output image by implementing blur removal processing on the first stored image in which the first image and the second image are additively stored. In the blur removal processing, the first stored image is transformed based on the point spread functions corresponding to the first position and the second position. Here, the pixel value at the coordinates (X, Y) of the output image is defined as O(X, Y).

Weight normalization is performed to derive the output image O(X, Y). In other words, the pixel value of the stored image is divided by the weight. This is because the weight of storing is different between the pixels of the stored image. B(X, Y) is divided by W(X, Y).

[Formula 19]

$$O(X, Y) = \frac{B(X, Y)}{W(X, Y)} \quad (19)$$

In step S16, the PSF (Point Spread Function, i.e., blur function) of the stored image is estimated. It is known that the PSF of an image that is captured while sweeping the focus position in some range is uniform in the screen regardless of the depth of the subject. (H. Nagahara, S. Kuthirummal, C. Zhou, and S. K. Nayer, "Flexible Depth of Field Photography," Proc. European Conf, Computer Vision, pp. 60-73, 2008).

Figure 5:
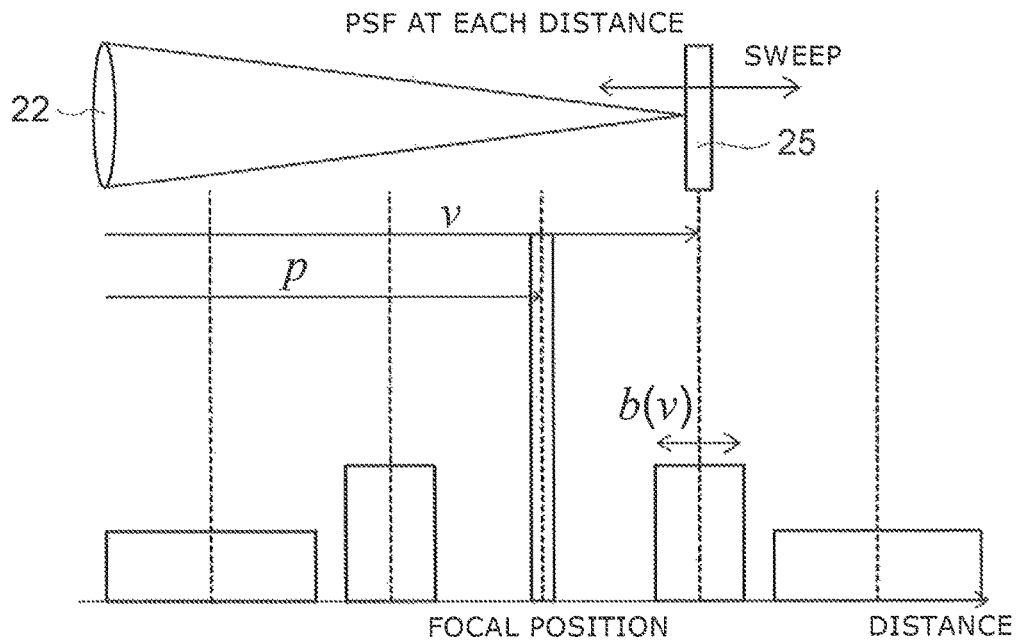
FIG. 5 is a schematic view showing a method for estimating the PSF.
Figure 6:
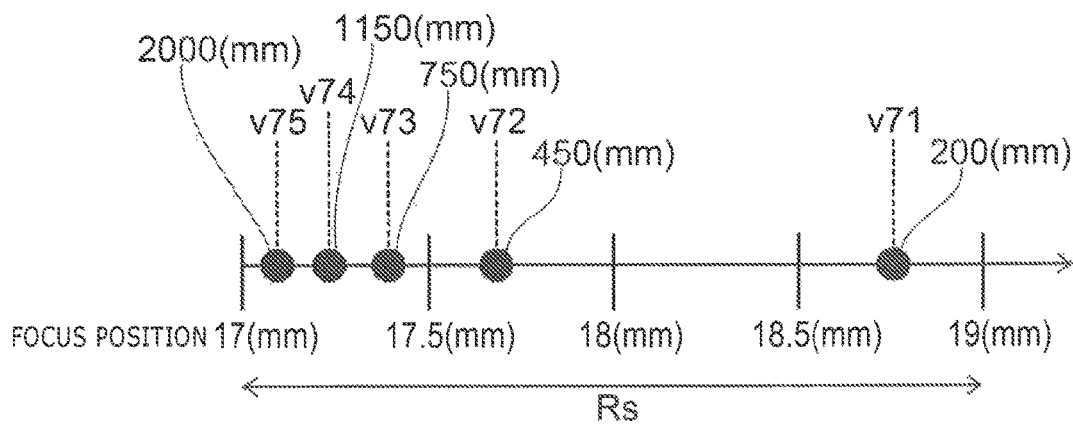
FIG. 6 is a schematic view showing a method for estimating the PSF.
Figure 7:
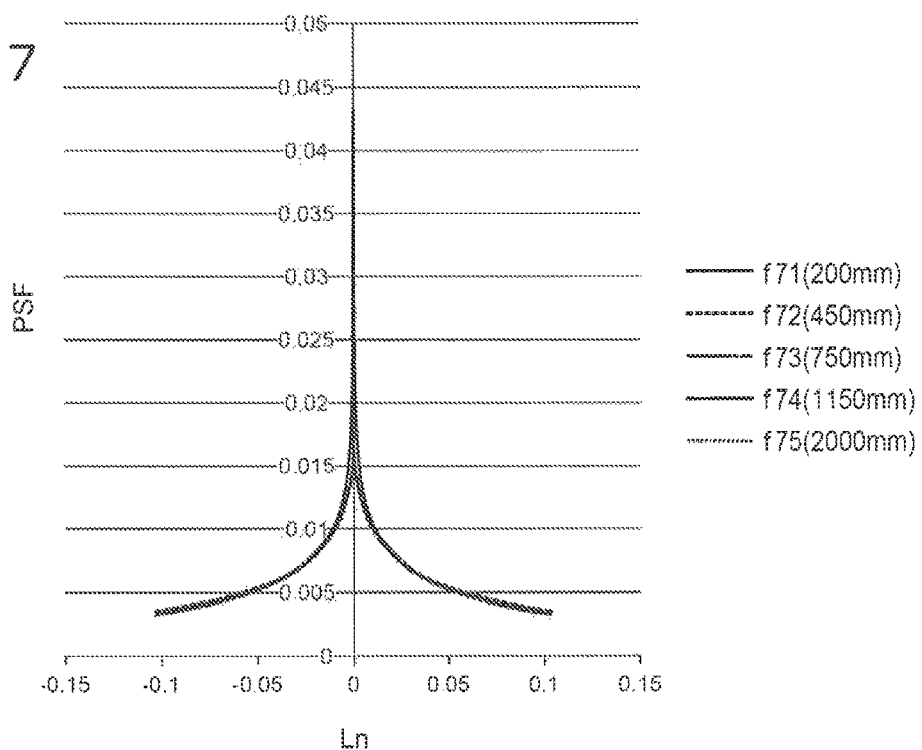
FIG. 7 is a schematic view showing a method for estimating the PSF.

FIGS. 5 to 7 are schematic views illustrating a method for estimating the PSF.

First, the PSF of an image that is captured by performing a focus sweep will be described. In the focus sweep, one image is captured in one capturing by changing the focus position from a proximal location to a distal location when exposing. In the case where the focus sweep is performed, an image that is blurred uniformly in the screen is captured.

FIG. 5 shows the PSF at the focus position v. For example, the aperture width can be calculated by $a=f/f_{num}$, where the focal length of the lens is f, and the f-number of the lens is $f_{num}$. When in focus, the blur diameter can be calculated as follows, where the focus position is p, and one focus position is v.

[Formula 20]

$$b(p) = \frac{a}{v}|v - p| \quad (20)$$

The blur diameter b(v) increases as the focus position v moves away from the position p.

For example, the PSF is considered for the situation shown in FIG. 6. Here, the sweep range Rs is from 17 (mm) to 19 (mm).

In such a case, a subject b71 is in focus when the focus position v is a position v71. Here, the subject b71 is disposed at a position separated 200 (mm) along the Z-axis direction from the imaging element 25.

Similarly, a subject b72, a subject b73, a subject b74, and a subject b75 are in focus at a focus position v72, a focus position v73, a focus position v74, and a focus position v75, respectively. The distances along the Z-axis direction between the imaging element 25 and the subjects b72 to b75 are 450 (mm), 750 (mm), 1150 (mm), and 2000 (mm), respectively.

For such a situation, the PSFs at each position described in regard to FIG. 5 are added while finely moving the focus position v. Thereby, FIG. 7 is made. Here, the PSF is taken to be convolved uniformly inside the blur diameter (a pillbox). FIG. 7 estimates the PSF of the image that is captured while performing the focus sweep. In FIG. 7, the vertical axis is the value of the PSF; and the horizontal axis is a distance Ln from one pixel.

In FIG. 7, the multiple PSFs for the different focus positions of the focusing are superimposed. Namely, the multiple PSFs (f71 to f75) are superimposed. The PSFs f71 to f75 are the PSFs of the pixel corresponding to the images of the subjects b71 to b75, respectively. Thus, the PSFs overlap each other; and it can be seen that the PSF is not dependent on the depth of the image.

Figure 8:
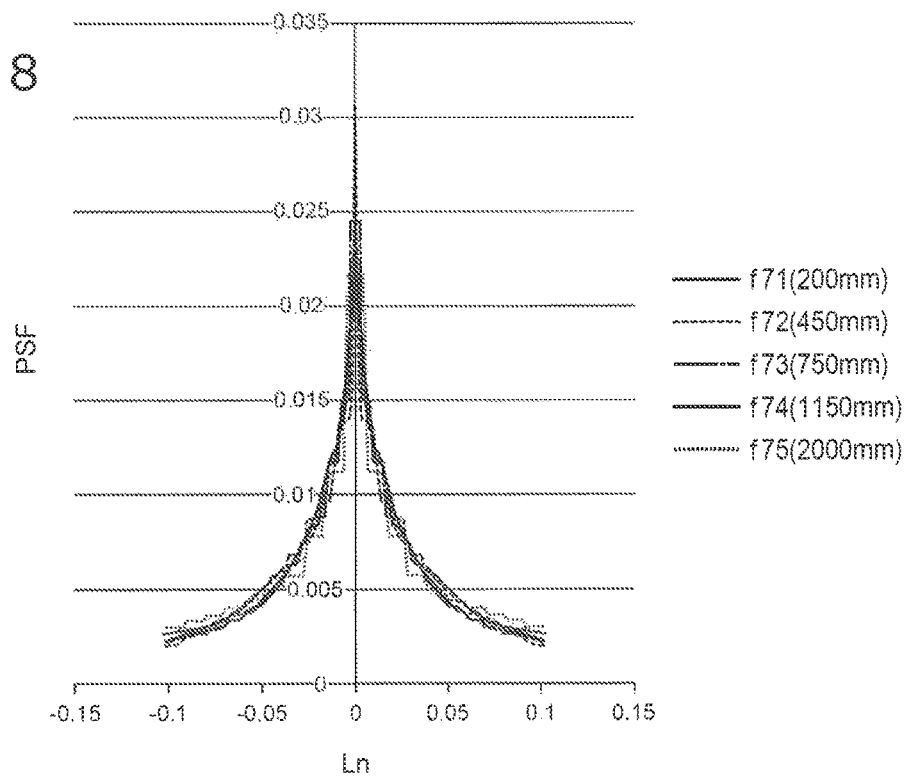
FIG. 8 is a schematic view showing the PSF.

The example described in regard to FIG. 5 to FIG. 7 is an example of a focus sweep in which the focus position is swept continuously. Conversely, in the embodiment, as described above, the stored image is derived by repeating the modification of the focus position and the capturing and by additively storing the multiple images that are captured. The embodiment is a so-called discrete focus sweep. FIG. 8 shows the PSF for the case where the modification of the focus position is discrete and has 10 steps. Although the PSFs shown in FIG. 8 are not as smooth as the PSFs shown in FIG. 7, it can be seen that the PSF substantially is not dependent on the depth of the image.

In step S17, the image processor 30 restores the image from the stored image using the PSF that is estimated. In the restoration, for example, a Wiener Filter, etc., may be used. The matrix representation of the PSF that is estimated is the matrix h.

By setting the Fourier transform of the output image to [Formula 21], $$O(u) \quad (21)$$

setting the Fourier transform of the restoration image to [Formula 22], and $$\hat{O}(u) \quad (22)$$

setting the Fourier transform of the PSF to [Formula 23], $$H(u) \quad (23)$$

the Wiener Filter can be calculated by

[Formula 24]

$$\hat{O}(u) = \frac{O(u)}{H(u)} \frac{|H(u)|}{|H(u)| + \frac{\sigma_n^2}{\sigma_s^2}}. \quad (24)$$

The restoration image is formed using the inverse Fourier transform. Here, $\sigma_n^2/\sigma_s^2$ is the signal-to-noise ratio.

As described above, a high-quality image can be obtained by modifying the focus position and capturing, by repeating the modification of the focus position and the capturing, and by adding the images. For example, in a camera mounted in a portable terminal such as a smartphone, etc., the aperture stop of the camera cannot be finely adjusted; and there are cases where the depth of field is shallow. In such a camera as well, for example, an all-focused image can be obtained by using the image processing method or the image processing device according to the embodiment.

Figure 9:
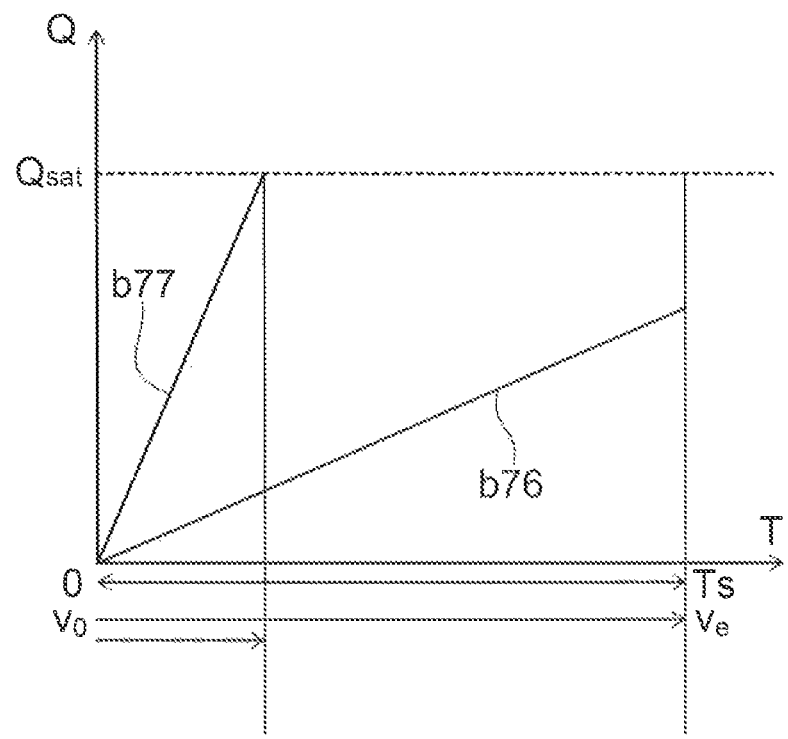
FIG. 9 is a schematic view showing characteristics of an image processing device of a reference example.

FIG. 9 is a schematic view illustrating characteristics of an image processing device of a reference example.

In the method of the reference example, as in the focus sweep described above, the focus position is changed (swept) when exposing; art image that is blurred uniformly in the screen is acquired; and an all-focused image is obtained by performing blur removal processing on the image.

FIG. 9 shows the relationship between a charge Q and time T in the case where the image is captured by a focus sweep. The vertical axis of FIG. 9 is the charge Q stored in the pixel of the imaging element. The horizontal axis of FIG. 9 Is the time T. For example, the interval from T=0 to T=Ts is the sweep time. In the sweep time, the focus position v (the sweep position) is changed from $v_0$ to $v_e$ as time elapses; and the image is captured. In the example, the exposure is continued during the sweep time.

Compared to the case where a normal subject (e.g., an indoor subject) b76 is captured, the charge is stored more quickly in the pixel (e.g., the photodiode) in the case where a bright subject b77 is captured. In the case where the bright subject b77 is captured, the charge Q undesirably reaches a saturation Qsat before the sweep of the focus position is completed. When a bright subject such as an outdoor subject, etc., is captured in the focus sweep, the pixel quickly becomes saturated; and there are cases where there is not enough time for the sweep.

Conversely, in the embodiment, the modification of the focus position and the capturing are repeated. Thus, by separating the exposure and the sweep, for example, an all-focused image can be generated without worrying about the saturation of the pixel.

Figure 10:
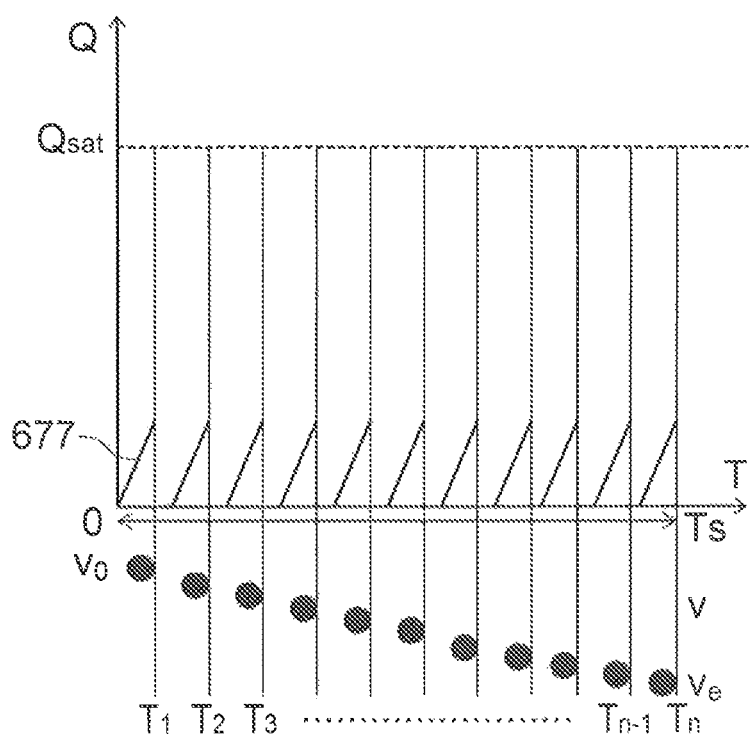
FIG. 10 is a schematic view showing characteristics of the image processing device according to the first embodiment.

FIG. 10 is a schematic view illustrating characteristics of the image processing device according to the first embodiment.

In FIG. 10 as well, the vertical axis is the charge Q; and the horizontal axis is the time T. The dots below FIG. 10 illustrate the times when the images are captured, and the focus positions v at these times. In the sweep time (from T=0 to T=Ts), the capturing is performed at times T1, T2 . . . , Tn Illustrated by the dots of the figure. The focus positions at the times are different from each other. In the example, the focus position is fixed when exposing. However, in the embodiment, the focus position may be moved when exposing.

As shown in FIG. 10, the charge that is stored in the pixel is reset for each capturing. Thereby, the pixel does not become saturated easily, even in the case where a bright subject b77 is captured. For example, a high quality all-focused image of even a bright subject can be obtained.

Second Embodiment

Figure 11:
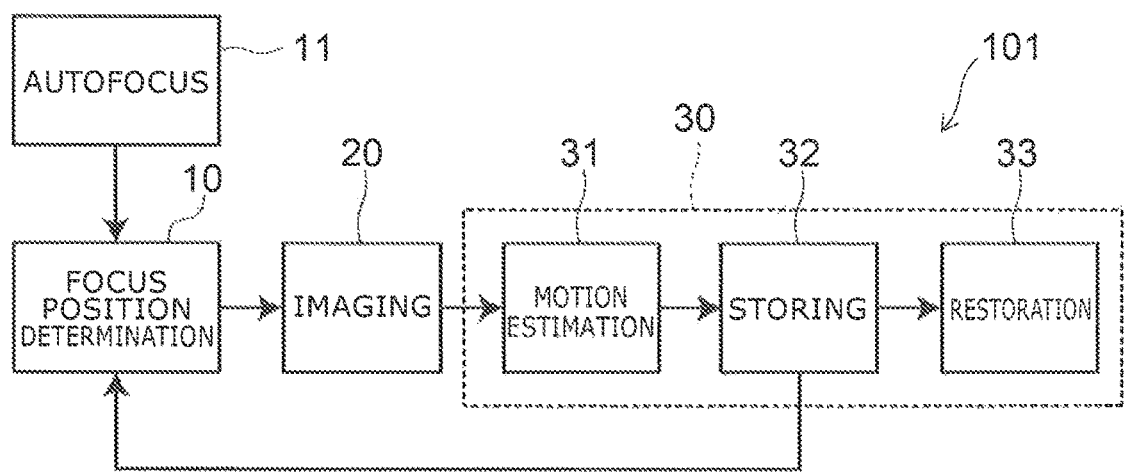
FIG. 11 is a block diagram showing an image processing device according to a second embodiment.

FIG. 11 is a block diagram illustrating an image processing device according to a second embodiment.

Figure 12:
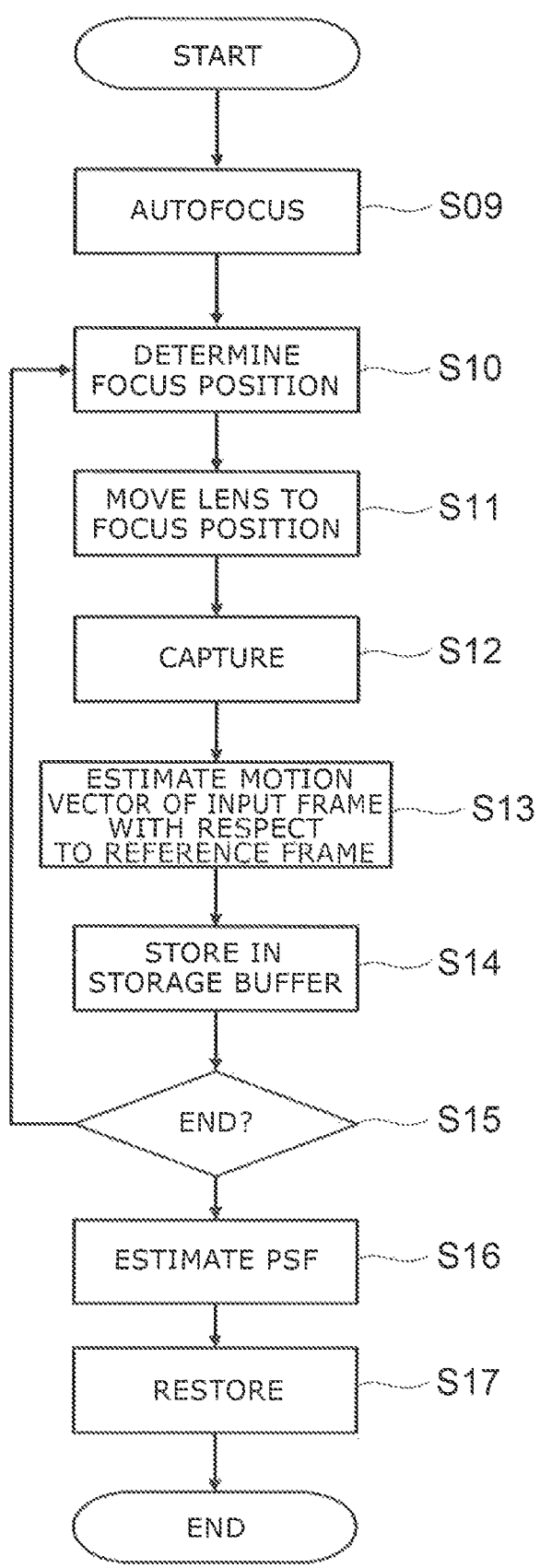
FIG. 12 is a flowchart showing operations of the image processing device according to the second embodiment.

FIG. 12 is a flowchart illustrating operations of the image processing device according to the second embodiment.

As shown in FIG. 11, compared to the image processing device 100, the image processing device 101 according to the second embodiment further includes an autofocus detector 11. The autofocus detector 11 performs the autofocus (AF) function of a camera. It is possible to realize the autofocus function using various methods. For example, contrast AF that focuses at the position where the contrast of the image is a maximum, phase difference AF that focuses by acquiring a phase difference, etc., can be used. In the embodiment, the AF method is not particularly limited.

In addition to step S10 to step S17 described in the first embodiment, the image processing method of the image processing device 101 further includes step S09 as shown in FIG. 12.

In step S09, any subject is brought into focus by the autofocus function. The autofocus detector 11 detects the focus position to be in focus.

In step S10, the sweep range Rs is set based on the focus position detected by the autofocus. The sweep range Rs is set as follows to be frontward and/or rearward of a focus position $v_{AF}$ detected by the autofocus.

$$v_0 = v_{AF} - \Delta v$$

$$v_e = v_{AF} + \Delta v$$

Here, $\Delta v$ is a predetermined frontward/rearward sweep width. In the first embodiment, the entire sweep range Rs is a predetermined range. In the embodiment, the sweep range Rs is determined dynamically when capturing.

For example, the focus position in the state in which the imaging unit 20 is focused on the subject is set to be the first position; and an input image is captured at the first position. The first position is set to be the reference; the second position is set to be frontward and/or rearward of the first position; and an input image is further captured at the second position.

Thus, in the second embodiment, the autofocus of the camera also is used in combination. The focus position is swept frontward and/or rearward from the position of being in focus due to the autofocus. Thereby, not only can an all-focused image corresponding to all depthward positions be obtained; but also an Image corresponding to a range centered at any subject can be obtained.

Third Embodiment

Figure 13:
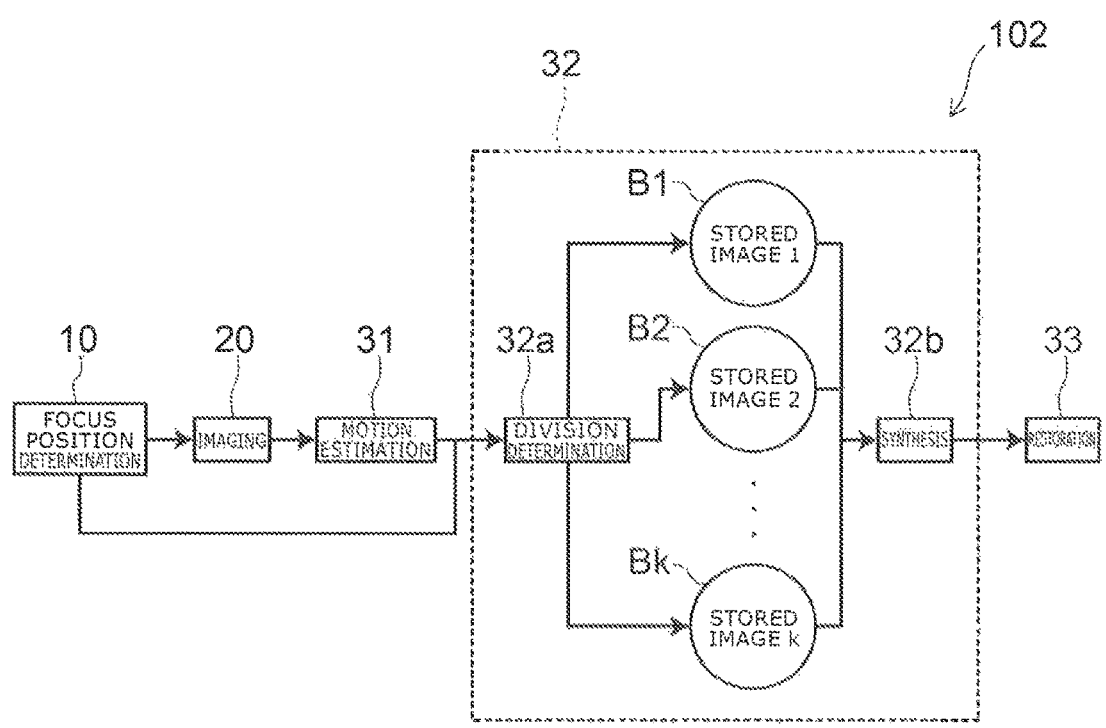
FIG. 13 is a block diagram showing an image processing device according to a third embodiment.

FIG. 13 is a block diagram illustrating an image processing device according to a third embodiment.

FIG. 14A to FIG. 14E and FIG. 15 are schematic views illustrating operations of the image processing device according to the third embodiment.

As shown in FIG. 13, compared to the image processing device 100 according to the first embodiment, the processing of the storage unit 32 in the image processing device 102 according to the third embodiment is different. In the embodiment, the storage unit 32 includes a division determination unit 32a and a synthesizer 32b.

Figure 14:
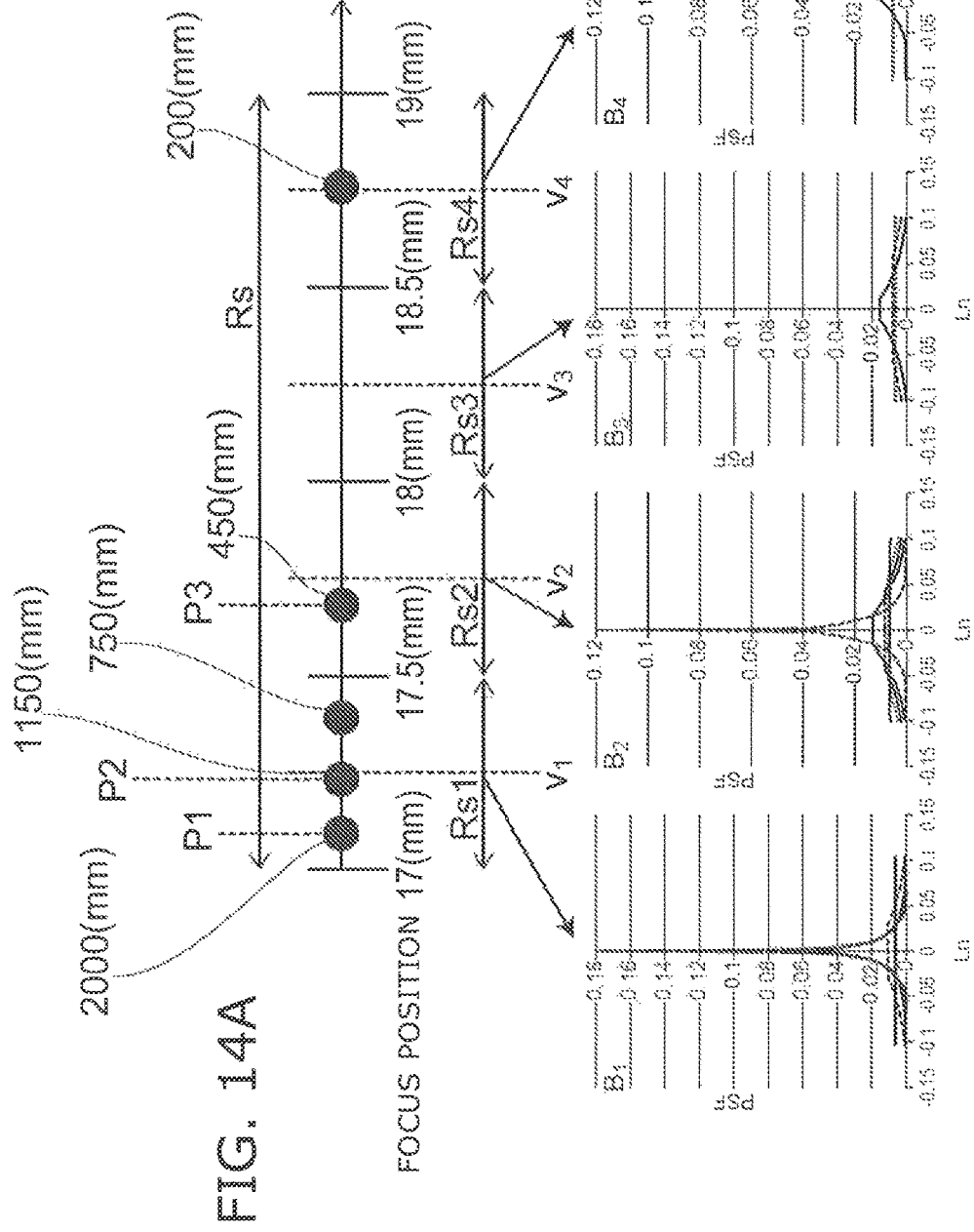
FIG. 14A to FIG. 14E are schematic views showing operations of the image processing device according to the third embodiment.

In the example shown in FIG. 14A, the subjects b71 to b75 are disposed similarly to the situation described in regard to FIG. 6. In the embodiment as shown in FIG. 14A, the sweep range Rs is divided into a plurality; and the focus position is swept in divisions through the sweep range Rs (a divided sweep). The focus position is not swept through the entire sweep range Rs at once. In the example, the sweep range Rs is divided into first to fourth sweep ranges Rs1 to Rs4. For example, a stored image similar to that of the first embodiment is derived for each sweep range. The multiple stored images that are derived are synthesized; and a high-quality output image is obtained by performing blur removal processing on the synthesized image.

The range in which the focus position is changeable includes the first sweep range Rs1 and the second sweep range Rs2. The first sweep range Rs1 includes a first position P1 (a first range) and a second position P2 (a second range). The second sweep range Rs2 is different from the first sweep range Rs1 and includes a third position P3 (a third range).

The image processor 30 derives the first stored image by adding the first image corresponding to the first position P1 and the second image corresponding to the second position P2.

The image processor 30 acquires the third image captured by the imaging element 25 when the focus position is the third position P3 (the third range), derives the second stored image to which at least the third image is added; and synthesizes the first stored image and the second stored image. Thus, a high-quality output image is obtained by performing blur removal processing on the synthesized image.

In the case where the entire sweep range Rs is divided into K divisions, the median of each of the K divisions is $$v_k, (k=1\ldots,K)$$

where k Is a natural number not more than K.

To match the divisions, stored images are prepared for the number of divisions.

$$B_k(X,Y), (k=1\ldots,K)$$

Similarly, storing weight images are prepared for the number of divisions.

$$W_k(X,Y), (k=1\ldots,K)$$

The focus position v is the focus position when capturing the input image. The division determination unit 32a determines the division to which the input image belongs. The division (k-hat) to which the input image belongs is determined by, for example, a nearest neighbor search such as the following.

[Formula 25]

$$\hat{k} = \underset{k}{\operatorname{argmin}}(v_k - v)^2 \tag{25}$$

Here, the search for k to minimize E is expressed by the following.

[Formula 26]

$$\underset{k}{\operatorname{argmin}} E(k) \tag{26}$$

The input image is stored in the stored image corresponding to the division determined by the division determination unit 32a.

[Formula 27]

$$B_{\hat{k}}(X,Y) += I_{src}(x,y;v) \tag{27}$$

Here, z+=a means that a is added to z.

Similarly, the weight is stored in the storing weight image.

[Formula 28]

$$W_{\hat{k}}(X,Y) += 1.0 \tag{28}$$

Subsequently, weight normalization is performed. Namely, the pixel value of the stored image is divided by the weight. This is because the weight of storing is different between the pixels of the stored image. Then, the stored output image can be calculated as follows.

[Formula 29]

$$O_k(X,Y) = \frac{B_k(X,Y)}{W_k(X,Y)}, (k=1,\ldots,K) \tag{29}$$

Thus, multiple stored images (stored output images) are obtained by being derived for each division. When the storing is completed, the stored output images are synthesized by the synthesizer 32b. For the synthesis, for example, it is sufficient to select the portions having the highest frequency. Namely,

[Formula 30]

$$\hat{O}(X,Y) = \underset{k}{\max}(\nabla O_k(X,Y))^2. \tag{30}$$

Here, Δ is the operator for calculating the gradient of the pixel value inside the image. In the most simple example, Δ calculates the difference between the pixel values of the pixels arranged in the vertical direction inside the image and the difference between the pixel values of the pixels arranged in the horizontal direction inside the image. Using the optimization formula recited above, the stored output image in which the gradient is a maximum is selected.

FIG. 14B shows the PSFs of a stored image $B_1$ corresponding to the first sweep range Rs1 (the first division). Similarly, FIG. 14C to FIG. 14E show the PSFs of stored images $B_2$ to $B_4$ corresponding to the second to fourth sweep ranges Rs2 to Rs4 (the second to fourth divisions).

In FIG. 14B to FIG. 14E and FIG. 15, the vertical axis is the value of the PSF; and the horizontal axis is the distance Ln from one pixel. In FIG. 14B to FIG. 14E and FIG. 15, similarly to FIG. 7, the multiple PSFs (f71 to f75) are superimposed.

For example, in the case where a wide sweep range Rs is used, the blur becomes greatly out of focus. The large blur is added to the PSF. Therefore, the value at the tail of the PSF becomes large. Accordingly, in the case where the wide sweep range Rs is used, the blur of the image has reduced contrast. This causes the image quality of the output image to decrease.

Conversely, in the embodiment as in FIG. 14A to FIG. 14E, the sweep range Rs is divided; and multiple stored images are acquired. As in Formula (30), the optimal portions from each of the stored images are selected and synthesized. Thereby, for example, the shape of the PSF is greatly improved because the images that are greatly out of focus are not added.

For example, in FIG. 14B, the PSFs corresponding to the subjects b73, b74, and b75 have good shapes in which the value at the tail is small. Therefore, for the subjects b73 to b75, the image of the stored image $B_1$ is selected for the synthesis of the stored image. On the other hand, the image is greatly out of focus in a stored image $B_3$ because a subject does not exist at the position corresponding to the division Rs3. The tail is long for the PSFs shown in FIG. 14D. The stored image $B_3$ is not selected for the synthesis of the stored image.

Figure 15:
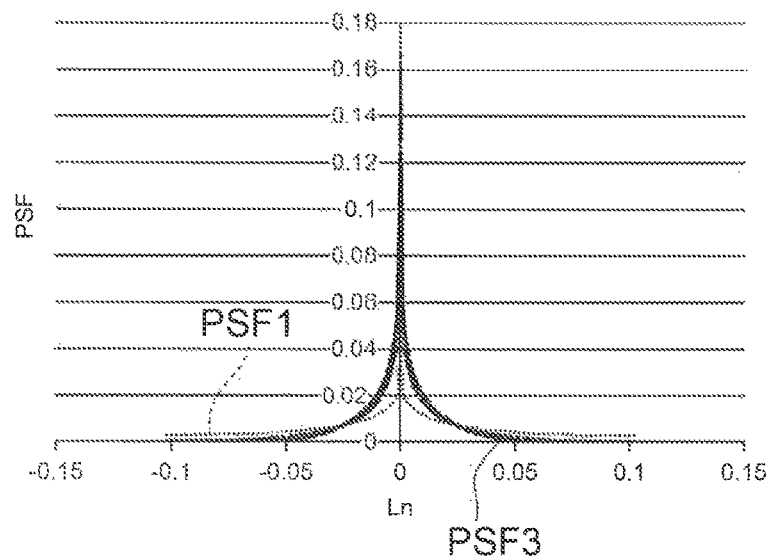
FIG. 15 is a schematic view showing operations of the image processing device according to the third embodiment.

As recited above, FIG. 15 shows the PSF (the PSF3) of the image in which the stored images $B_1$ to $B_4$ are synthesized. As a reference in FIG. 15, a PSF (a PSF1) is superimposed for the case where a wide sweep range Rs is used without dividing the sweep range Rs. Compared to the PSF3, the tail of the PSF1 is long which may cause flare, etc. Conversely, the shape of the tail is improved by the divided sweep of the PSF3; and an output image having higher image quality can be obtained.

Fourth Embodiment

Figure 16:
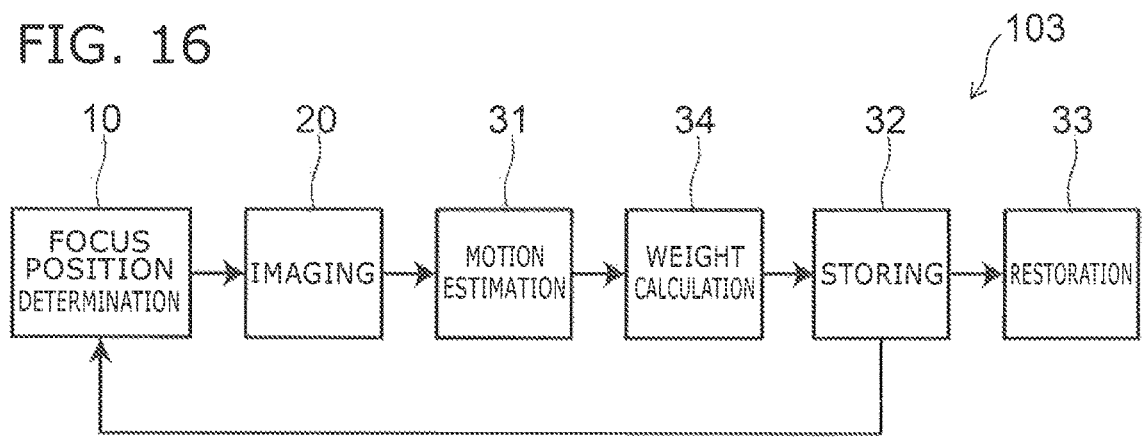
FIG. 16 is a block diagram showing an image processing device according to a fourth embodiment.

FIG. 16 is a block diagram illustrating an image processing device according to a fourth embodiment.

In the image processing device 103 according to the fourth embodiment as shown in FIG. 16, the image processor 30 further includes a weight calculator 34. Otherwise, the image processing device 103 is similar to the image processing device 100.

In the weight calculator 34, the weight of storing is determined according to the edge intensity of the input image.

In the image processing device 100, the weight of storing is determined by Formula (18). Conversely, in the embodiment, based on the edge intensity of the image, regions that have high edge intensities are taken to be in focus; and the weight of storing is increased. Regions that have low edge intensities are taken to be out of focus; and the weight of storing is reduced. Thereby, the weight is relatively large for the images that are in focus. Thereby, similarly to the divided sweep, the shape of the PSF can be improved; and an image having higher image quality can be obtained.

For example, the Laplacian may be used as the edge intensity calculated in the weight calculation step.

[Formula 31]

$$d(x,y)=I_{src}(x,y-1;v)+I_{src}(x-1,y;v)+I_{src}(x+1,y;v)+I_{src}(x,y+1;v)-4I_{src}(x,y;v) \qquad (31)$$

Here, d(x, y) is the edge intensity. The gradient of the image (e.g., the differential of the pixel value at each pixel), etc., may be used.

As the weight, for example, the following may be used.

[Formula 32]

$$w(x,y)=d(x,y)^2 \qquad (32)$$

Or, as the weight, the following may be used.

[Formula 33]

$$w(x,y)=|d(x,y)| \qquad (33)$$

Thereby, the weight of storing can be increased when the edge intensity is high. However, in the embodiment, various values may be considered as the edge intensity. The edge intensity corresponds to the shading on the input image, i.e., the size of the change of the pixel value. For example, the edge intensity corresponds to the difference between the pixel value of one pixel and the pixel values of the pixels disposed around the one pixel. In the embodiment, the edge intensity is not limited to the edge intensity recited above.

The input image having weighting is stored in the stored image as follows.

[Formula 34]

$$B(X,Y)+=w(x,y)I_{src}(x,y;v) \qquad (34)$$

In other words, the image processor 30 derives the stored image (the first stored image) based on the weight of each pixel of the input image (e.g., the first image). The weight is determined according to the edge intensity inside the input image.

The weight is stored in the storing weight image as follows.

[Formula 35]

$$W(X,Y)+=w(x,y) \qquad (35)$$

A blur removal processing similar to that of the first embodiment is performed on such a stored image. Thereby, a high-quality image can be obtained. According to the embodiment, the image quality can be increased similarly to the divided sweep described in the third embodiment using one stored image.

Figure 17:
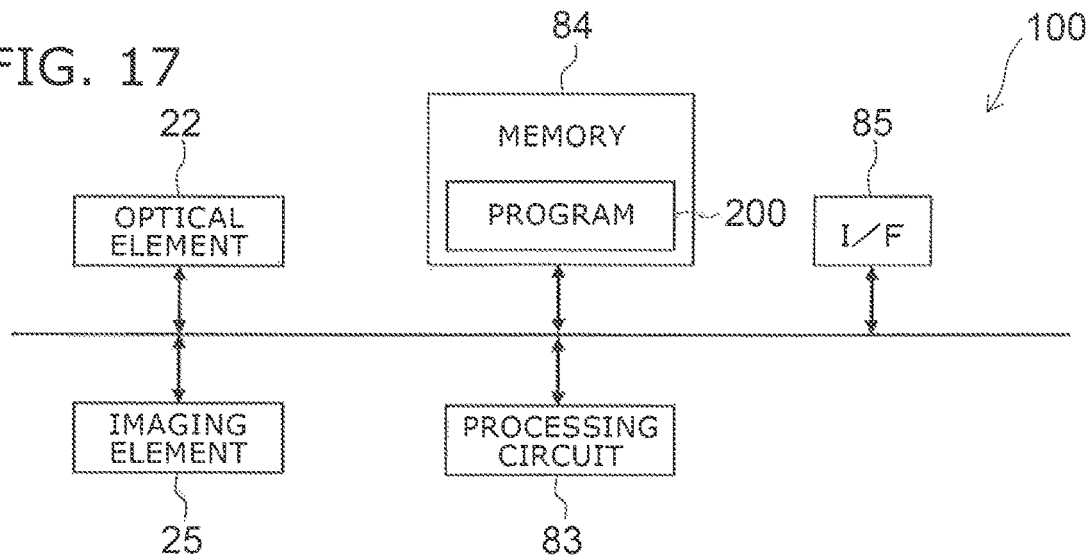
FIG. 17 is a block diagram showing the image processing device according to the embodiment.

FIG. 17 is a block diagram illustrating the image processing device according to the embodiment.

FIG. 17 is a block diagram showing the hardware configuration of the image processing device 100. The example shown in FIG. 17 is an example of the display device according to the embodiment and does not necessarily match an actual module.

The image processing device 100 includes, for example, the optical element (the lens 22), the imaging element 25, a processing circuit 83, and a storage medium (memory 84).

A signal corresponding to the light incident from the subject is detected by the imaging unit (the lens 22 and the imaging element 25). The processing described in regard to the focus position determination unit 10 and the image processor 30 is implemented by the processing circuit 83 and the memory 84.

The memory 84 may include a memory device such as non-transitory ROM, RAM, etc. An external memory device such as a HDD, a SSD, etc., may be used. The memory 84 stores the signal detected by the imaging unit, i.e., the input image. Also, the stored image, the storing weight image, the output image, etc., are stored.

The memory 84 stores an image processing program 200 that causes a computer or the like to execute the Image processing method according to the embodiment. For example, in the processing circuit 83, the program 200 is read; and the image processing is executed. The program 200 may be provided in the state of being pre-stored in the memory 84, may be provided via an external storage medium or a network, or may be installed as appropriate.

The processing circuit 83 may include, for example, a controller such as a CPU (Central Processing Unit), etc., an integrated circuit such as LSI (Large Scale Integration), etc., an IC (Integrated Circuit) chipset, etc. The processing circuit 83 and the memory 84 may be provided in one substrate; and at least a portion of the processing circuit 83 and the memory 84 may be provided separately. The integrated circuit is not limited to LSI; and a dedicated circuit or a general-purpose processor may be used. The processing circuit 83 and the memory 84 may include a hardware configuration that utilizes a normal computer. Each component of the image processing device according to the embodiment described above may be software or hardware. In the embodiment, the processing of a portion of each functional block may be a program implemented by a computer.

The image processing device 100 may further include an interface 85. For example, data relating to the output image is output to an external display device, etc., via the interface 85. A wired or wireless method may be used for the external connection.

In the embodiment, the storage medium that stores the program 200 may be a computer-readable non-transitory storage medium. The storage medium may include, for example, CD-ROM (-R/-RW), a magneto-optical disk, a HD (hard disk), DVD-ROM (-R/-RW/-RAM), a FD (flexible disk), flash memory, a memory card, a memory stick, other various ROM, RAM, etc.

According to the embodiments, an image processing device, an image processing method, and an image processing program that provide a high-quality image can be provided.

In the specification of the application, "perpendicular" includes not only strictly perpendicular but also, for example, the fluctuation due to manufacturing processes, etc.; and it is sufficient to be substantially perpendicular.

Hereinabove, embodiments of the invention are described with reference to specific examples. However, the embodiments of the invention are not limited to these specific examples. For example, one skilled in the art may similarly practice the invention by appropriately selecting specific configurations of components such as the imaging element, the lens, the imaging unit, the position determination unit, the image processor, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all image processing devices, image processing methods, and image processing programs practicable by an appropriate design modification by one skilled in the art based on the image processing devices, the image processing methods, and the image processing programs described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An image processing device, comprising:
   an imaging element;
   a lens, light passing through the lens toward the imaging element, a relative position of the imaging element and the lens being changeable; and
   an image processor that
   acquires a first image, the first image being captured by the imaging element when the relative position is in a first range,
   acquires a second image, the second image being captured by the imaging element when the relative position is in a second range different from the first range,
   derives a first stored image by adding at least a portion of the second image to the first image,
   and
   derives a revised first stored image by adding at least a portion of a third image to the first stored image whenever the third image is acquired, the third image being captured by the imaging element when the relative position is in a third range different from the first range and different from the second range.

2. The device according to claim 1, wherein the image processor calculates a motion vector according to a difference between a position of an object inside the first image and a position of the object inside the second image, and adds the second image to the first image based on the motion vector.

3. The device according to claim 1, further comprising a position determination unit that determines to perform the capturing when the relative position is in the first range.

4. The device according to claim 1, wherein the image processor derives an output image by implementing blur removal processing on the first stored image.

5. The device according to claim 1, wherein the relative position is changed in the capturing of the first image.

6. The device according to claim 1, wherein
   the first image is captured when the relative position is a first position inside the first range, and
   the second image is captured when the relative position is a second position inside the second range.

7. The device according to claim 6, wherein
   the first position is the relative position in a state of the lens being focused on an object, and
   the second position is determined using the first position as a reference.

8. The device according to claim 6, wherein
   the first position is the relative position where a distance between the imaging element and a center of the lens in an optical axis direction is a focal length of the lens, and
   the second position is the relative position causing the distance between the center and the imaging element to be shorter than the focal length.

9. The device according to claim 6, wherein each of the first position and the second position is at least one of a plurality of positions arranged at uniform spacing in a range, the relative position being changeable in the range.

10. An image processing method, comprising:
    acquiring a first image captured by an imaging element when a relative position of the imaging element and a lens is in a first range, light passing through the lens toward the imaging element;
    acquiring a second image captured by the imaging element when the relative position is in a second range different from the first range; and
    deriving a first stored image by adding at least a portion of the second image to the first image;

and deriving a revised first stored image by adding at least a portion of a third image to the first stored image whenever the third image is acquired, the third image being captured by the imaging element when the relative position is in a third range different from the first range and different from the second range.

11. The method according to claim 10, wherein a motion vector is calculated according to a difference between a position of an object inside the first image and a position of the object inside the second image, and the first stored image is derived by adding the second image to the first image based on the motion vector.

12. The method according to claim 10, wherein the capturing is determined to be performed when the relative position is in the first range.

13. The method according to claim 10, wherein an output image is derived by implementing blur removal processing on the first stored image.

14. A computer readable non-transitory storage medium comprising an image processing program, the program causing a computer to execute processing of:

acquiring a first image captured by an imaging element when a relative position of the imaging element and a lens is in a first range, light passing through the lens toward the imaging element;

acquiring a second image captured by the imaging element when the relative position is in a second range different from the first range; and deriving a first stored image by adding at least a portion of the second image to the first image; and deriving a revised first stored image by adding at least a portion of a third image to the first stored image whenever the third image is acquired, the third image being captured by the imaging element when the relative position is in a third range different from the first range and different from the second range.

15. The storage medium according to claim 14, wherein a motion vector is calculated according to a difference between a position of an object inside the first image and a position of the object inside the second image, and the first stored image is derived by adding the second image to the first image based on the motion vector.

16. The storage medium according to claim 14, wherein the program causes the computer to execute processing of determining to perform the capturing when the relative position is in the first range.

17. The storage medium according to claim 14, wherein the program causes the computer to execute processing of deriving an output image by implementing blur removal processing on the first stored image.

* * * * *